(12) United States Patent
Dixon et al.

(10) Patent No.: US 7,009,395 B2
(45) Date of Patent: Mar. 7, 2006

(54) METHOD FOR MRI WITH STEADY-STATE FREE PRECESSION PULSE SEQUENCES

(75) Inventors: William Thomas Dixon, Clifton Park, NY (US); Christopher Judson Hardy, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 587 days.

(21) Appl. No.: 10/063,807

(22) Filed: May 15, 2002

(65) Prior Publication Data

US 2003/0214293 A1 Nov. 20, 2003

(51) Int. Cl.
*G01V 3/00* (2006.01)
(52) U.S. Cl. ...................... 324/309; 324/307
(58) Field of Classification Search ........... 324/309, 324/307, 306, 312, 314, 300
See application file for complete search history.

(56) References Cited

U.S. PATENT DOCUMENTS

| | | | | |
|---|---|---|---|---|
| 5,270,652 A | | 12/1993 | Dixon et al. | 324/309 |
| 6,016,057 A | | 1/2000 | Ma | 324/309 |
| 6,307,368 B1 | | 10/2001 | Vasanawala et al. | 324/309 |
| 6,552,542 B1 | * | 4/2003 | Overall | 324/309 |
| 6,750,651 B1 | * | 6/2004 | Overall | 324/309 |
| 6,794,870 B1 | * | 9/2004 | Hennig | 324/309 |
| 6,819,104 B1 | * | 11/2004 | Yamazaki et al. | 324/307 |

FOREIGN PATENT DOCUMENTS

| | | |
|---|---|---|
| JP | 59231438 | 12/1984 |
| JP | 60151548 | 8/1985 |
| JP | 03133427 | 6/1991 |
| WO | 03044553 | 5/2003 |

OTHER PUBLICATIONS

ME Stromski, HR Brady, SR Gullans and S. Patz, "Application of Missing Pulse Steady State Free Precession To The Study Of Renal Microcirculation," Magnetic Resonance in Medicine 20, pp. 66-77, (1991).

S. Patz, STS Wong, and MS Roos, "Missing Pulse Steady-State Free Precession," Magnetic Resonance in Medicine 10, pp. 194-209, (1989).

W.R. Overall, et al., "Steady-State Sequence Sysnthesis", PROC. INTL. SOC. MAG. RESON. MED. 10, 2002 XP-002327461, conference abstract.

C.J. Hardy, et al., "Steady-State Free Precession Imaging with Inherent Fat Suppression", PROC. INTL. SOC. MAG. RESON. MED. 10, 2002, XP002327462, conference abstract.

(Continued)

*Primary Examiner*—Louis Arana
(74) *Attorney, Agent, or Firm*—Jean K. Testa; Christian G. Cabou

(57) ABSTRACT

A method and system are provided for acquiring images using a magnetic resonance imaging (MRI) system. The method comprises the step of applying a plurality of steady-state free precession (SSFP) radio-frequency (RF) excitation pulses in a selected pattern of varying amplitudes and phases such that signals corresponding to the pattern of pulses are substantially immune to magnetic field inhomogeneity of the MRI system. The pulses have substantially equal spacing between all neighboring pulses and between successive groups of pulses. The method further comprises the step of reading a plurality of signals corresponding to the pulses.

12 Claims, 3 Drawing Sheets

OTHER PUBLICATIONS

S. Patz, et al., "Missing Pulse Steady-State Free Precession", Magnetic Resonance in Medicine, Academic Press, Duluth, MN, USA, vol. 10, No. 2, May 1, 1989, pp. 194-209.

S.S. Vasanawala, et al., "Fluctuating Equilibrium MRI", MAG. RESON. MED., vol. 42, 1999, pp. 876-883, XP 002327463.

S.S. Vasanawala, et al., Linear Combination of Steady-State Free Precession MRI, Magnetic Resonance in Medicin, Academic Press, Duluth, Mn, USA, vol. 43, 2000, pp. 82-90, XP 002232807.

European Search Report for RD-29640, May 24, 2005.

* cited by examiner

METHOD FOR MRI WITH STEADY-STATE FREE PRECESSION PULSE SEQUENCES

BACKGROUND OF INVENTION

The present invention relates generally to magnetic resonance imaging (MRI), and more particularly to a MRI pulse sequences employing steady-state free precession.

MRI pulse sequences that take advantage of steady-state free precession (SSFP), e.g. Siemens' "True-FISP", General Electric's "FIESTA", and Phillip's "Balanced FFE", allow fast imaging without excessive saturation of signals. In practice, SSFP is extremely useful for rapid imaging with relatively high signal-to-noise ratio of fluids such as blood. However, these sequences are inherently sensitive to static magnetic field inhomogeneity. In particular, inhomogeneity tends to create curvilinear regions of signal void in the FIESTA image generally appearing as black lines or voids, potentially obscuring areas of interest or mimicking pathology.

A method is needed for MRI with steady-state free precession pulse sequences that is insensitive to static magnetic field inhomogeneity in order to prevent, for example, the creation of these black lines while retaining the needed T2*/T1 contrast and high signal-to-noise ratio provided by SSFP.

SUMMARY OF INVENTION

In a first aspect, a method is provided for acquiring images using a magnetic resonance imaging (MRI) system. The method comprises the step of applying a plurality of steady-state free precession (SSFP) radio-frequency (RF) excitation pulses in a selected pattern of varying amplitudes and phases such that signals corresponding to the pattern of pulses are substantially immune to magnetic field inhomogeneity of the MRI system. The pulses have substantially equal spacing between all neighboring pulses and between successive groups of pulses. The method further comprises the step of reading a plurality of signals corresponding to the pulses In a second aspect, a system is provided for acquiring images using a magnetic resonance imaging (MRI) system. The system comprises a magnetic field driver for driving a field gradient, a magnetic field controller for controlling the magnetic field, a transmitter for generating a radio frequency (RF) pulse to cause resonance and wherein the transmitter is adapted to generate a plurality of steady-state free precession (SSFP) radio-frequency (RF) excitation pulses in a selected pattern and wherein the pulses have substantially equal spacing between all neighboring pulses and between successive groups of pulses, and a receiver for receiving and detecting magnetic resonance signals generated from the object, and processor for performing image reconstruction and for generating images for display. The receiver is further adapted to read a plurality of signals corresponding to the pulses and wherein the signals are substantially immune to magnetic field inhomogeneity of the MRI system.

BRIEF DESCRIPTION OF DRAWINGS

The features and advantages of the present invention will become apparent from the following detailed description of the invention when read with the accompanying drawings in which.

DETAILED DESCRIPTION

Figure 1:
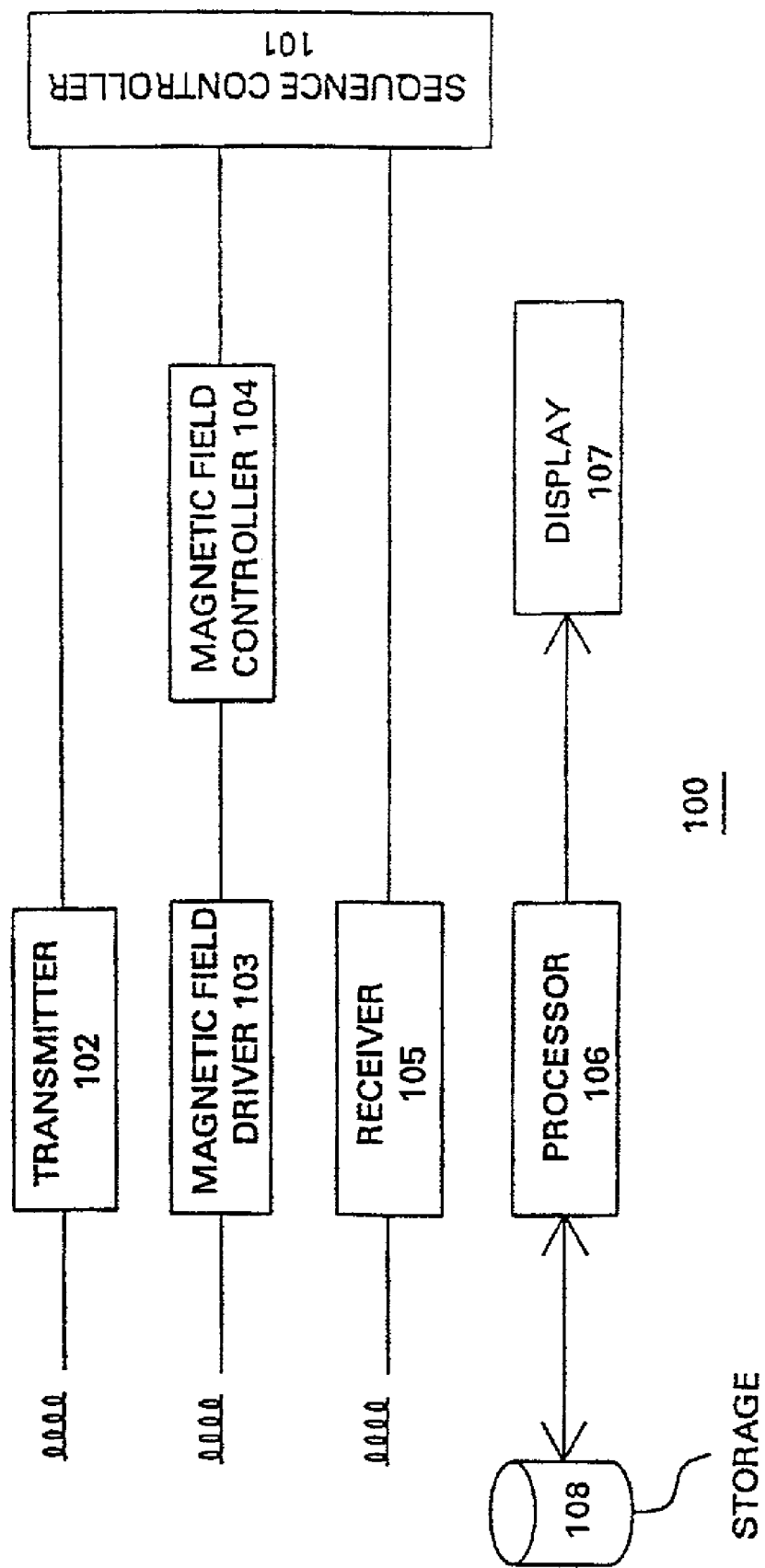
FIG. 1 is a block diagram of a Magnetic Resonance Imaging (MRI) system to which embodiments of the present invention are applicable.

Referring to FIG. 1, there is shown a block diagram of a magnetic resonance imaging (MRI) system for which embodiments of the present invention are applicable. The MRI system 100 comprises a sequence controller 101 for controlling various components of the system, as is well-known, for detecting magnetic resonance signals from the part of an object being imaged; a transmitter 102 for generating an radio frequency (RF) pulse to cause resonance; a magnetic field driver 103 for driving a field gradient in a known manner; a magnetic field controller 104 for controlling the magnetic field; a receiver 105 for receiving and detecting magnetic resonance signals generated from the object; a processor 106 for performing image reconstruction and various calculations for system operation; a display 107 for displaying images; and a peripheral memory device 108 for storing detected signal data and reconstructed k-space data.

In a well-known manner, processor 106 is configured such that there is sufficient memory for storing measured data and reconstructed images. The memory is sufficient to store the whole of N-dimensional measured data as well as reconstructed data. Also in a well-known manner, a MR image is constructed from the image or k-space data corresponding to a predetermined plurality of applications of a MRI pulse sequence initiated by a RF pulse such as from transmitter 102 of FIG. 1. The image is updated by collecting image or k-space data from repetitive MRI pulse sequences. An MR image is reconstructed by performing a series of Fourier transforms along a set of orthogonal directions in k-space. As used herein, "adapted to", "configured" and the like refer to operation capabilities of electrical elements such as analog or digital computers or application specific devices (such as an application specific integrated circuit (ASIC)) that are programmed to perform a sequel to provide an output in response to given input signals.

As a general description, magnetic resonance imaging (MRI) is a well-known imaging method in which magnetic moments are excited at specific nuclear spin precession frequencies that are proportional to the magnetic field occurring within the magnet of the MRI system. Spin is a fundamental property of nature, such as electrical charge or mass. Precession is a rotational motion about an axis of a vector whose origin is fixed at the origin. The radio-frequency (RF) signals resulting from the precession of these spins are received typically using RF coils in the MRI system and are used to generate images of a volume of interest. A pulse sequence is a selected series of RF pulses and/or magnetic field gradients applied to a spin system to produce a signal representative of some property of the spin system. Described herein are embodiments employing steady-state free precession (SSFP) pulse sequences adapted to reduce sensitivity to magnetic field inhomogeneities. SSFP pulse sequences are generally used for fast imaging without excessive saturation of signals. SSFP pulse sequences are particularly useful for cardiac and cerebral spinal fluid (CSF) imaging applications. MRI pulse sequences that take advantage of steady-state free precession (SSFP), e.g. Siemens' "True-FISP", General Electric's "FIESTA", and Phillip's "Balanced FFE", can rapidly create images characterized by T2*/T1 contrast. The time constant that describes the return to equilibrium of the transverse magnetization, $M_{XY}$, is called the spin-spin relaxation time, T2. T1 governs the rate of recovery of the longitudinal magnetization. T2* is the spin-spin relaxation time composed of contributions from molecular interactions and inhomogeneities in the magnetic field.

In Bloch simulations of SSFP, it has been shown that a variation of steady-state transverse magnetization occurs with chemical shift. Transverse magnetization refers to the XY component of the net magnetization. Chemical shift refers generally to a variation in the resonance frequency of a nuclear spin due to the chemical environment around the nucleus. Chemical shift is typically reported in parts per million (ppm) or Hz.

Figure 2:
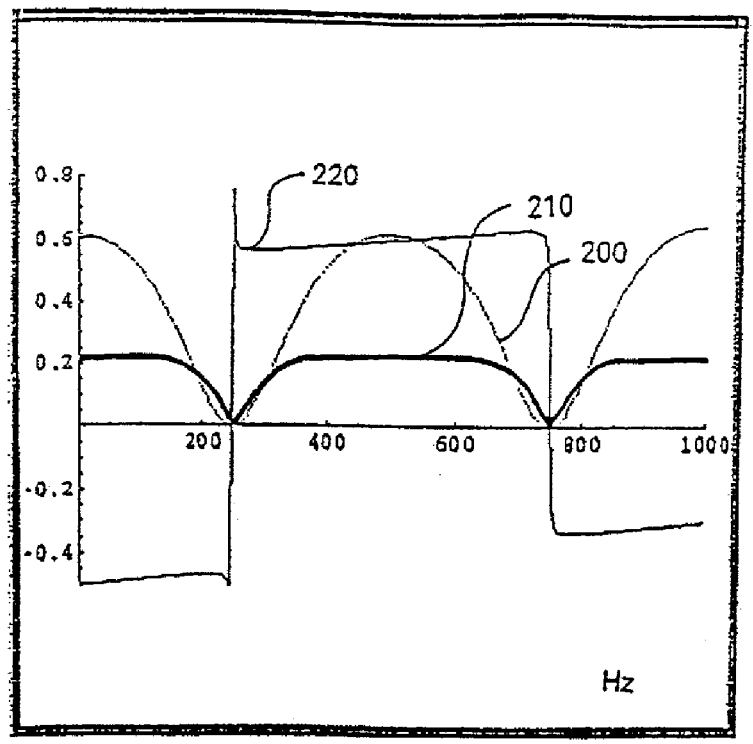
FIG. 2 is a graphical illustration of chemical-shift behavior for a FIESTA steady-state free precession (SSFP) pulse sequence; and, FIG. 3 is an exemplary FIESTA image to which embodiments of the present invention are applicable; and, FIG. 4 is a graphical illustration of magnetization and phase for an embodiment of a SSFP pulse sequence of the present invention.
Figure 3:
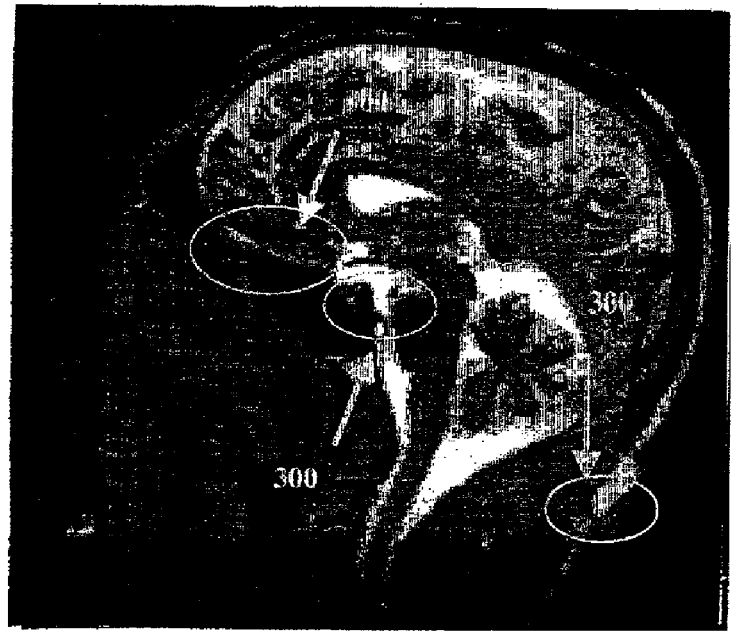

The chemical-shift behavior of the FIESTA pulse sequence is shown in FIG. 2. Referring to FIG. 2, exemplary embodiments of longitudinal 200 and transverse 210 magnetization are shown, with phase normalized to $2\pi$ (220), as a function of resonance offset, in Hz, for a FIESTA pulse sequence with TR=2 ms, tip angle 40°, T1=1000 ms, T=200 ms. The phase of the RF pulse alternates between 0 and $\pi$ in this exemplary embodiment shown in FIG. 2. Because the magnetization steady state depends sensitively on the phase of the magnetization when each RF pulse is applied, both the longitudinal 200 and transverse 210 magnetization exhibit repeated dips as a function of frequency (or, alternatively, magnetic field strength). These dips have a periodicity of 1/(2TR), where TR is the pulse-sequence repetition time. In the presence of magnetic field inhomogeneity, some regions of the image fall within one of the null regions of the graph of FIG. 2, which results in signal void (shown as 300) within the image, as shown by the example of FIG. 3. Shortening the TR will push the null regions of FIG. 2 farther apart from each other, resulting in fewer black lines in the image. However, the practical lower limit of TR is currently in the range of 2 to 4 ms for most 1.5 Tesla (1.5T) MRI scanners, meaning the nulls can be pushed no farther than around 250 Hz apart. This corresponds to an inhomogeneity of 4 parts per million (ppm) at 1.5 T, which is commonly experienced in human in vivo imaging, especially at air/tissue interfaces, where differences in magnetic susceptibility between neighboring regions can cause local inhomogeneities. The problem is even worse at 3T, where the TR would have to be cut in half to achieve the same insensitivity to B0 variation. It is to be appreciated that embodiments of the present invention can be modified for field strengths other than 1.5T.

Figure 4A:
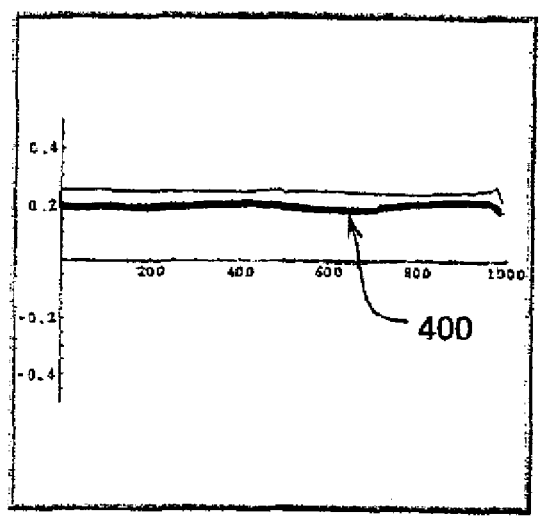
Figure 4B:
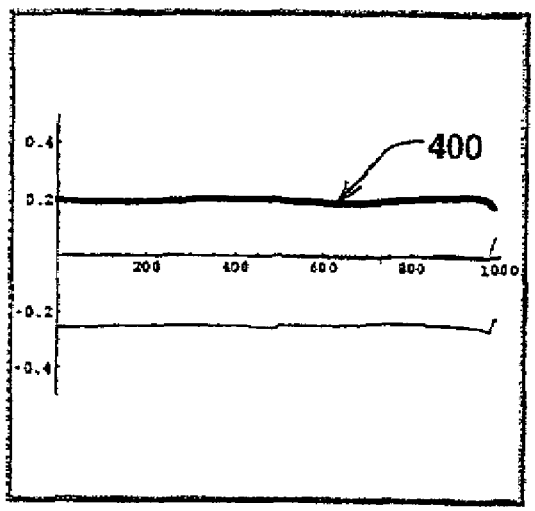
Figure 4C:
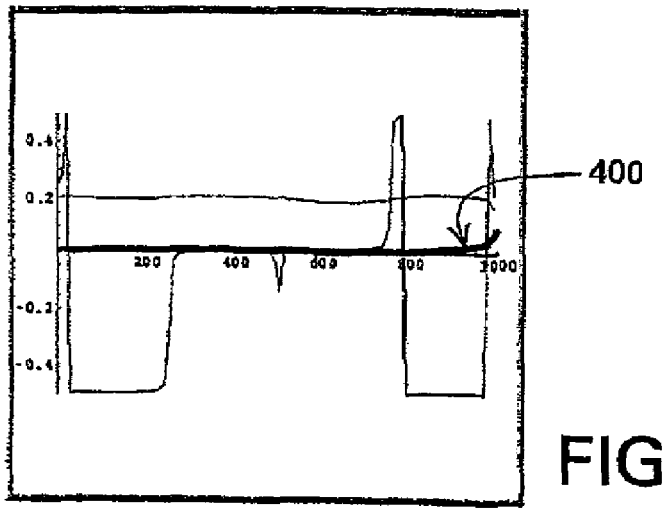

It is possible to prevent many of these null regions, however, by employing a repeating pattern of pulses of a particular kind. In an embodiment of the present invention, a method is described for acquiring images using a magnetic resonance imaging (MRI) system. The method comprises the step of applying a plurality of steady-state free precession (SSFP) radio-frequency (RF) excitation pulses in a selected pattern of varying amplitudes and phases such that signals corresponding to the pattern of pulses are substantially immune to magnetic field inhomogeneity of the MRI system. The pulses have substantially equal spacing between all neighboring pulses and between successive groups of pulses. The method further comprises the step of reading a plurality of signals corresponding to the pulses. These pulses can be used in the context of a steady-state-free-precession sequence without disrupting the steady state. In a first embodiment, the simplest of these patterns consists of three pulses 90° (x), 180° (−x), 90° (x), with equal spacing between all neighboring pulses, and between successive groups of pulses. Here the±x (and ±y, which will be referenced later) refer to the pulse phases in a manner well-known in the art. FIG. 4 shows the steady-state magnetization for this pulse sequence, for the signal read after the first 90 (FIG. 4A), after the 180 (FIG. 4B), and after the second 90 (FIG. 4C). It can be seen that the transverse magnetization (400) for the signals read on either side of the 180 do not exhibit the nulls seen in conventional FIESTA, and are thus relatively immune to static magnetic field inhomogeneity. In the exemplary embodiment shown in FIG. 4, T1=400 ms, T2=200 ms, TR=2 ms.

In further embodiments, other selected patterns of pulses may exhibit robustness to magnetic field inhomogeneity. Such patterns include: 90° (y), 180° (x), 90° (−y); 90° (y), 180° (x), 180° (x), 180° (x), 180° (x), 90° (−y); 90° (y), 180° (x), 180° (−x), 180° (−x), 180° (x), 90° (−y); and, 90° (y), 180° (x), 180° (x), 180° (−x), 180° (−x), 90° (−y).

In some cases it is possible to improve the behavior of these sequences even more by inserting gradient spoiler pulses during those periods when the magnetization is oriented predominantly in the longitudinal direction, i.e. between the last 90 of a sequence and the first 90 of the following group. FIG. 4C gives one example of such a period.

Furthermore, embodiments for a system for MRI are also provided. The system includes the components of FIG. 1 as described above and further comprises transmitter 102 being adapted to perform according to the methods described herein. An embodiment of a system for Magnetic Resonance Imaging (MRI) for acquiring images of an object comprises a magnetic field driver for driving a field gradient, a magnetic field controller for controlling the magnetic field, a transmitter for generating an radio frequency (RF) pulse to cause resonance and wherein the transmitter is adapted to a transmitter for generating an radio frequency (RF) pulse to cause resonance and wherein the transmitter is adapted to generate a plurality of steady-state free precession (SSFP) radio-frequency (RF) excitation pulses in a selected pattern, the pulses having substantially equal spacing between all neighboring pulses and between successive groups of pulses. Further provided, is a receiver for receiving and detecting magnetic resonance signals generated from the object, the receiver further adapted to read a plurality of signals corresponding to the pulses and wherein the signals are substantially immune to magnetic field inhomogeneity of the MRI system. The receiver receives and detects magnetic resonance signals generated from the object, and, a processor for performing image reconstruction and for generating images for display. Thus, transmitter 102 is desirably adapted to generate and apply during imaging with the MRI system a plurality of steady-state free precession (SSFP) radio-frequency (RF) excitation pulses employing the methods described above to acquire signals that are substantially immune to static magnetic field inhomogeneity.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for acquiring images using a magnetic resonance imaging (MRI) system, the method comprising:

applying a plurality of steady-state free precession (SSFP) radio-frequency (RF) excitation pulses in a selected pattern of varying amplitudes and phases, the pulses having substantially equal spacing between all neighboring pulses and between successive groups of pulses; and, reading a plurality of signals corresponding to the pulses and wherein the signals are substantially immune to magnetic field inhomogeneity of the MRI system.

2. The method of claim 1 wherein the pattern is three pulses occurring at 90°(x), 180° (−x) and 90° (x).

3. The method of claim 1 wherein the pattern is three pulses occurring at 90°(y), 180° (x), 90° (−y).

4. The method of claim 1 wherein the pattern is pulses occurring at 90° (y), 180° (x), 180° (x), 180° (x), 180° (x), 90° (−y).

5. The method of claim 1 wherein the pattern is pulses occurring at 90°(y), 180° (x), 180° (−x), 180° (−x), 180° (x), 90° (−y).

6. The method of claim 1 wherein the pattern is pulses occurring at 90°(y), 180° (x), 180° (x), 180° (−x), 180° (−x), 90° (−y).

7. The method of claim 1 further comprising the step of inserting gradient spoiler pulses in a period when magnetization is oriented predominantly in a longitudinal direction.

8. A system for Magnetic Resonance Imaging (MRI) for acquiring images of an object comprising:

a magnetic field driver for driving a field gradient;

a magnetic field controller for controlling the magnetic field;

a transmitter for generating an radio frequency (RF) pulse to cause resonance and wherein the transmitter is adapted to generate a plurality of steady-state free precession (SSFP) radio-frequency (RF) excitation pulses in a selected pattern of varying amplitudes and phases, the pulses having substantially equal spacing between all neighboring pulses and between successive groups of pulses; and, a receiver for receiving and detecting magnetic resonance signals generated from the object, the receiver being further adapted to read a plurality of signals corresponding to the pulses and wherein the signals are substantially immune to magnetic field inhomogeneity of the MRI system; and, a processor for performing image reconstruction and for generating images for display.

9. The system of claim 8 wherein the transmitter is adapted to generate the selected pattern having three pulses occurring at 90°(x), 180° (−x) and 90° (x).

10. The system of claim 8 wherein the transmitter is adapted to generate the selected pattern having pulses occurring at 90°(y), 180° (x), 180° (x), 180° (x), 180° (x), 90° (−y).

11. The system of claim 8 wherein the transmitter is adapted to generate the selected pattern three pulses occurring at 90°(y), 180° (x), 180° (−x), 180° (−x) 180° (x), 90° (−y).

12. The system of claim 8 wherein the transmitter is adapted to generate the selected pattern having pulses occurring 90°(y), 180° (x), 180° (x), 180° (−x), 180° (−x) 90° (−y).

* * * * *